United States Patent
Ramani et al.

(10) Patent No.: US 6,442,542 B1
(45) Date of Patent: Aug. 27, 2002

(54) DIAGNOSTIC SYSTEM WITH LEARNING CAPABILITIES

(75) Inventors: Vipin Kewal Ramani, Niskayuna; Rasiklal Punjalal Shah, Latham, both of NY (US); Ramesh Ramachandran, Overland Park, KS (US); Piero Patrone Bonissone, Schenectady; Yu-To Chen, Niskayuna, both of NY (US); Phillip Edward Steen; John Andrew Johnson, both of Delafield, WI (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/415,408

(22) Filed: Oct. 8, 1999

(51) Int. Cl.[7] .............................................. G06F 17/30
(52) U.S. Cl. ..................... 707/3; 707/104.1; 706/47; 714/26; 714/25
(58) Field of Search ..................... 707/1, 5, 6, 104, 707/3, 4; 702/35; 706/14, 16, 25, 47; 714/25–26, 37

(56) References Cited

U.S. PATENT DOCUMENTS

| | | | |
|---|---|---|---|
| 5,046,034 A | 9/1991 | Stark et al. | |
| 5,214,653 A | 5/1993 | Elliott, Jr. et al. | |
| 5,347,595 A | 9/1994 | Bokser | |

(List continued on next page.)

FOREIGN PATENT DOCUMENTS

| | | |
|---|---|---|
| DE | 9829640 A1 | 3/1999 |

OTHER PUBLICATIONS

"Generic Software Tool to Improve Diagnostic Systems by Feedback of Field Experience Data," Setaruddin et al., Proceedings of the 1990 IEEE conference on AUTOTEST-CON, Sep. 17–21, 1990, pp. 485–490.*

"Wavelet Analysis for Diagnostic Problems," Contu et al., Proceedings of the 1996 MELECON Conference, IEEE, vol. 3, May 13–16 1996, pp. 1571–1574.*

"Pattern–Based Fault Diagnosis Using Neural Networks," Dietz et al., Proceedings of the First International Conference of Industrial & Engineering Applications of Artificial Intelligence & Expert System, 1988, ACM Press, pp. 13–23.*

*Primary Examiner*—Hosain T. Alam
(74) *Attorney, Agent, or Firm*—David C. Goldman; Jill M. Breedlove

(57) ABSTRACT

A diagnostic system is provided for identifying faults in a machine (e.g., CT scanner, MRI system, x-ray apparatus) by analyzing a data file generated thereby. The diagnostic system includes a trained database containing a plurality of trained data, each trained data associated with one of plurality of known fault types. Each trained data is represented by a trained set of feature values and corresponding weight values. Once a data file is generated by the machine, a current set of feature values are extracted from the data file by performing various analyses (e.g., time domain analysis, frequency domain analysis, wavelet analysis). The current set of feature values extracted is analyzed by a fault detector which produces a candidate set of faults based on the trained set of feature values and corresponding weight values for each of the fault types. The candidate set of faults produced by the fault detector is presented to a user along with a recommend repair procedure. In cases where no fault is identified or in response to a misdiagnosis produced by the diagnostic system, the user may interactively input a faulty condition associated with the machine being diagnosed (e.g., based on his/her experience). The diagnostic system further includes a learning subsystem which automatically updates the plurality of trained data based on the faulty condition input by the user.

18 Claims, 5 Drawing Sheets

U.S. PATENT DOCUMENTS

| | | | |
|---|---|---|---|
| 5,351,247 A | * | 9/1994 | Dow et al. ................. 371/15.1 |
| 5,463,768 A | | 10/1995 | Cuddihy et al. |
| 5,533,093 A | * | 7/1996 | Horton et al. ................. 379/21 |
| 5,566,092 A | * | 10/1996 | Wang et al. ........... 364/551.02 |
| 5,764,509 A | * | 6/1998 | Gross et al. .................. 700/29 |
| 6,105,149 A | * | 8/2000 | Bonissone et al. ............ 706/62 |
| 6,138,109 A | * | 10/2000 | Grichnik et al. .............. 706/20 |

* cited by examiner

DIAGNOSTIC SYSTEM WITH LEARNING CAPABILITIES

FIELD OF THE INVENTION

The present invention generally relates to diagnostic systems and, in particular, to a diagnostic system with learning capabilities.

BACKGROUND OF THE INVENTION

Hospitals and other medical facilities utilize a variety of imaging scanner equipment, including computed tomography ("CT") scanners, magnetic resonance imaging ("MRI") systems, and x-ray apparatus to produce images of internal parts of test subjects under examination. Over time, these medical imaging devices may develop a wide variety of mechanical or electrical problems. If such problems are not resolved promptly, malfunctioning imaging devices may exhibit image quality imperfections, resulting in possible misdiagnosis in addition to economic losses.

One way to diagnose and repair imaging equipment suspected of malfunction is to have a field engineer run a system performance test ("SPT") to analyze the image quality or the state of the equipment. The SPT generates a number of data files which provide a "signature" of the operation of the; imaging equipment. The data files generated by the imaging equipment are analyzed by a knowledge facilitator (e.g., service engineer) who will try to identify faulty components or conditions associated therewith based on his/her accumulated experience with identifying malfunctions. Then, based on the diagnosis provided by the knowledge facilitator, the field engineer will try to correct the problem that may be causing the equipment malfunction.

One problem that occurs with the use of a knowledge facilitator to manually analyze data files is the difficulty associated with evaluating a large amount of imprecise information, as is usually the case for complex devices such as medical imaging equipment.

BRIEF SUMMARY OF THE INVENTION

Thus, there is a particular need for a system that is capable of diagnosing a machine by analyzing data generated thereby. In particular, there is a need for a diagnostic system capable of learning so that after each learning process the system's ability to identify the fault causing the machine malfunction may be enhanced. The learning process may occur in response to a misdiagnosis produced by the diagnostic system or in response to the system's inability to identify any fault. During the learning process, the trained data and rules used for diagnosing faults may be updated, based on fault type input by a knowledge facilitator, so as to more accurately identify a faulty component or condition during subsequent analysis.

The present invention is directed to a diagnostic system and corresponding method for identifying faults in a machine (e.g., CT scanner, MRI system, x-ray apparatus) by analyzing a data file generated thereby. The diagnostic system includes a trained database containing a plurality of trained data, each trained data associated with one of plurality of known fault types. Each trained data is represented by a trained set of feature values and corresponding weight values. Once a data file is generated by the machine (e.g., by performing a system performance test), a current set of feature values is extracted from the data file by performing various analyses (e.g., time domain analysis, frequency domain analysis, wavelet analysis). The current set of feature values extracted is analyzed by a fault detector which produces a candidate set of faults based on the trained set of feature values and corresponding weight values for each of the fault types. The candidate set of faults produced by the fault detector is presented to a user along with a recommended repair procedure. In cases where no fault is identified or a wrong fault is diagnosed, the user may interactively input a faulty condition associated with the machine being diagnosed (e.g., based on his/her experience). The diagnostic system further includes a learning subsystem which automatically updates the plurality of trained data based on the faulty condition input by the user.

DETAILED DESCRIPTION OF THE INVENTION

Figure 1:
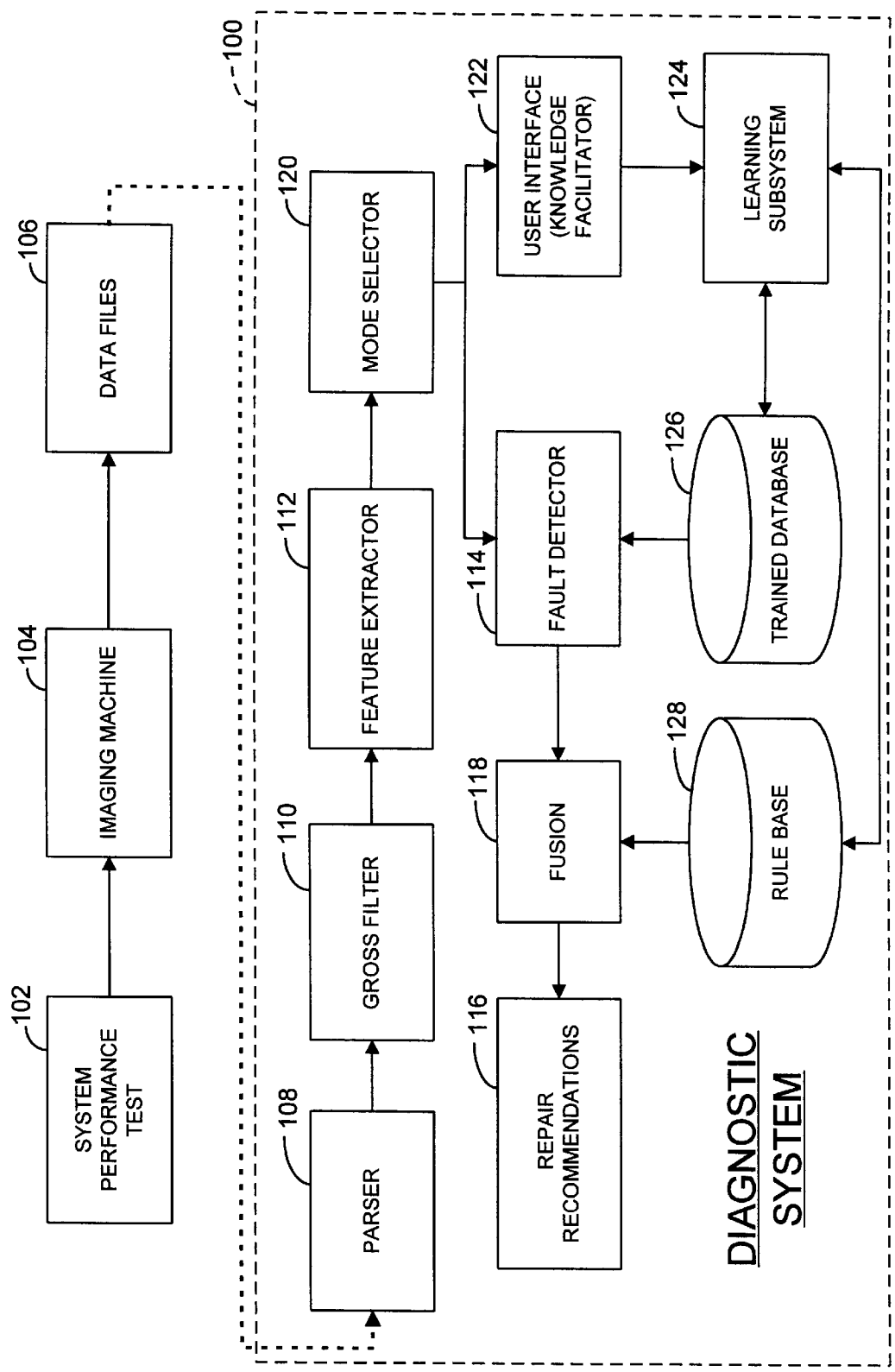
FIG. 1 is a block diagram illustrating a system for diagnosing faults in an imaging machine in accordance with the present invention.

FIGS. 1–4 illustrate the various features and embodiments of a diagnostic system of the present invention. Referring to FIG. 1, a block diagram is shown illustrating the overall architecture of the diagnostic system 100 according to the present invention. The present system 100 diagnoses E malfunctioning machine (e.g., a medical imaging device) by analyzing data files 106 which provide a "signature" of the operation of the machine. The data files may be generated by running a system performance test ("STP") 102 on the machine which will be described in more detail hereinbelow.

For ease of description and as an illustrative example, the malfunctioning machine 104 will be described in terms of a medical imaging device, such as computed tomography ("CT") scanners, magnetic resonance imaging ("MRI") systems, and x-ray apparatus. However, it is to be understood that the diagnostic system 100 in accordance with the present invention can be used to identify faults any machine which outputs signals or data that can be analyzed to extract features, whereby the extracted features serve as fingerprints for evaluating the operation and performance of the machine under diagnosis.

The SPT 102 may comprise one or more tests, each test configured to target identification of some specific problem areas of the machine being diagnosed. For example, the SPT for testing a medical imaging device may comprise a fast gradient echo ("FGRE") test adapted for sensing gradient related problems and a fast spin echo ("FSE") test adapted for sensing radio frequency related problems. The FGRE and FSE tests are performed at multiple locations of a calibration phantom placed on the gantry table of the imaging device, including the head and body areas thereof to generate a complete set of data files (e.g., head FGRE, body FGRE, head FSE and body FSE).

Continuing to refer to FIG. 1, the diagnostic system 100 includes a parser 108, a gross filter 110, feature extractor 112, fault detector 114, learning subsystem 124 and a trained database 126 containing data and rules which are accessible by the fault detector 114 for diagnosing faults in an imaging device. Also included in the diagnostic system are a mode selector 120 which allows a user to select between a training and analysis mode and a user interface 122 which presents a candidate set of faults identified by the fault detector to a user (e.g., a knowledge facilitator) and allows the user to interactively input a faulty condition associated with the machine. In the training mode, the diagnostic system is trained based on inputs made by a user or trained with data files having a known fault associated therewith. The training process is performed by a learning subsystem and is detailed in the flow chart of FIG. 2. In the analysis mode, data files generated by the malfunctioning machine are analyzed for the purposes of finding any symptoms that may point to the fault.

In either the training or analysis mode, the parser 108 receives the data files 106 generated by the malfunctioning machine and removes extraneous data from each data file to extract a flat file representing a slice-readout at a particular location. The parser 108 uses the extraneous data contained in the data files to generate an information file containing information about the imaging machine hardware, software version, magnet type, site information, date stamp and other relevant information.

Once flat files have been extracted from the data files, the gross filter 110 categorizes each flat file as normal and faulty data. The files that are categorized as normal are not analyzed by the diagnostic system and only the files that are categorized as being faulty are further processed. In this regard, the amount of computation time necessary to process the data files generated by the malfunctioning machine is reduced. The thresholds for distinguishing between normal and faulty data are selected on the conservative side so as to analyze borderline (normal-faulty) cases.

Next, the feature extractor 112 extracts a number of different features from the data files that are categorized as being faulty. The features extracted from the data files serve as fingerprints for evaluating the characteristics of the machine under diagnosis. As an example, the features extracted from the data file may include: (1) minimum; (2) maximum; (3) the peak-to-peak; (4) mean; (5) standard deviation; (6) minimum in the first 64 points (for eddy currents); (7) time when minimum in first 64 points occurs; (8) the sign of the minimum value in the first 64 points; (9) maximum in the first 64 points (for eddy currents); (10) time when maximum in first 64 points occurs; (11) the sign of the maximum value in the first 64 points; (12) the slope in the first 64 points; (13) maximum amplitude; (14) maximum frequency; (15) total power; (16) number of outliers; (17) number of spikes; (18) spike value; and (19) spike time.

In one embodiment, the features are extracted from each data file by performing a time domain analysis, a frequency domain analysis and a wavelet analysis. For the time domain analysis, the time series data is used to compute peak-to-peak values in a graph, the area under a curve (integral) in the graph, and the slope of a curve (derivative). The frequency domain analysis uses the Fast Fourier Transform ("FFT") to decompose a time-series plot of data into different frequency components for analyzing relative magnitudes. The wavelet analysis is achieved by using a discrete wavelet transform ("DWT") which is the counterpart of the FFT.

The features that are extracted from the time domain analysis are:

the minimum of the time series which is defined as:

$$v_{1,i} = \min_{j=1}^{n} x_1(t_j); \tag{1}$$

the maximum value of the time series which is defined as:

$$v_{2,i} = \max_{j=1}^{n} x_1(t_j); \tag{2}$$

the peak-to-peak distance of the time series which is defined as:

$$v_{3,i} = v_{2,i} - v_{1,i}; \tag{3}$$

the time series average which is defined as:

$$v_{4,i} = \frac{\sum_{j=1}^{n} x_i(t_j)}{n}; \tag{4}$$

the standard deviation of the time series which is defined as:

$$v_{5,i} = \frac{\sqrt{\sum_{j=1}^{n}(x_i(t_j) - v_{4,i})^2}}{n-1}; \tag{5}$$

the minimum absolute value of the time series during the first 64 sample which is defined as:

$$v_{6,i} = \min_{j=i}^{64}|x_i(t_j)|; \tag{6}$$

the time of minimum value for the first 64 samples which is defined as:

$$v_{7,i} = j_{min}: \text{ wherein } x_i(t_{jmin}) = v_{6,i}; \tag{7}$$

the sign of the minimum value for the first 64 samples which is defined as:

$$v_{8,i} = \text{sign}\{x_i(t_{jmin})\}, \text{ wherein } x_i(t_{jmin}) = v_{6,i}; \tag{8}$$

the maximum absolute value of the time series during the first 64 samples which is defined as:

$$v_{9,i} = \max_{j=i}^{64}|x_i(t_j)|; \tag{9}$$

the time of the maximum value for the first 64 samples which is defined as:

$$v_{10,i} = j_{max}, \text{ wherein } x_i(t_{jmax}) = v_{9,i}; \tag{10}$$

the sign of the maximum value for the first 64 samples which is defined as:

$$V_{11,i} = \text{sign}\{x_i(t_j\text{max})\} \text{ where } x_i(t_{jmax}) = v_{9,i}; \tag{11}$$

the slope of the line segment approximating the time series derivative during the first 64 samples which is defined as:

$$v_{12,i} = \frac{(x_i(t_{64}) - x_i(t_i))}{63};\qquad(12)$$

The features that are extracted from the frequency domain analysis are:

the maximum amplitude of the power spectrum which is defined as:

$$v_{13,i} = \max_{j=1}^{n} A_j;\qquad(13)$$

wherein $A_j$ is the $j^{th}$ amplitude of the FFT of $x_i(t_j)$;

the frequency at which the maximum amplitude occurs which is defined as:

$$v_{14,i} = \max_{j=1}^{n} F_j;\qquad(14)$$

wherein $F_j$ is the $j^{th}$ amplitude of the FFT of $x_i(t_j)$; and the total power which is defined as:

$$v_{15,i} = \sum_{j=1}^{n} C_j^2;\qquad(15)$$

wherein $C_j$ is the $j^{th}$ amplitude of the FFT of $x_i(t_j)$.

The features that are extracted from the wavelet analysis are determined after all of the coefficients of the wavelet transform $W_i$ have been computed. The first wavelet feature is the maximum absolute value among all spikes. This feature is applied to the points in the scatter plot of the last two wavelet coefficients ($W_{n,i}$, $W_{n-1,i}$). Since these coefficients are good indicators of spikes, the energy contained in a spike is not considered to be noticeable on the full-length time window used by the mother wavelet or by an FFT. However, the energy contained in the spike can be considerable and easy to detect once it is compared with the rest of the signal in a very reduced time window. In order to determine the maximum absolute value among all spikes, the centroid coordinates of the clustered data must first be computed. The centroid coordinates of the clustered data are defined as:

$$(C_k, C_{k-1}) = \left[ \frac{\sum_{j=1}^{n} W_k^j}{n}, \frac{\sum_{j=1}^{n} W_{k-1}^j}{n} \right]$$

Next, all the outliers (i.e., points that are considerably far from the centroid of clustered data) in the scatter plot are identified. The outliers are identified as:

$$d_{1,i} = \sqrt{(W_{k,i-C_k})^2 + (W_{k-1,i}-C_{k-1})^2}$$

Next, three standard deviation is used as the threshold for the outliers. Alternatively, filtering may be used to remove some noise for the weak signals around zero. Finally, the outlier that is the furthest away from the centroid, i.e., is considered to be the strongest spike which is defined as:

$$v_{16,i} = \max_j d_{1,i}^j;\qquad(16)$$

The next wavelet feature that is determined is the sign of the strongest spike which is defined as:

$$v_{17,i} = \text{sign}\{W_{k,jmax}\};\qquad(17)$$

wherein $$\sqrt{(W_{k,jmax-C_k})^2 + (W_{k-1,jmax-C_{k-1}})^2} = v_{16,i}$$

Another wavelet feature that is determined is the time at which the strongest spike occurs which is defined as:

$$v_{18,i} = j_{max};\qquad(18)$$

wherein $$\sqrt{(W_{k,jmax-C_k})^2 + (W_{k-1,jmax-C_{k-1}})^2} = v_{16,i}$$

Still another wavelet feature that is determined is the number of spikes which is defined as:

$$v_{19,i} = \sum_{j=1}^{k} d_{1,j};\qquad(19)$$

wherein $d_{1,j}$ is greater than 3 standard deviation.

Figure 2:
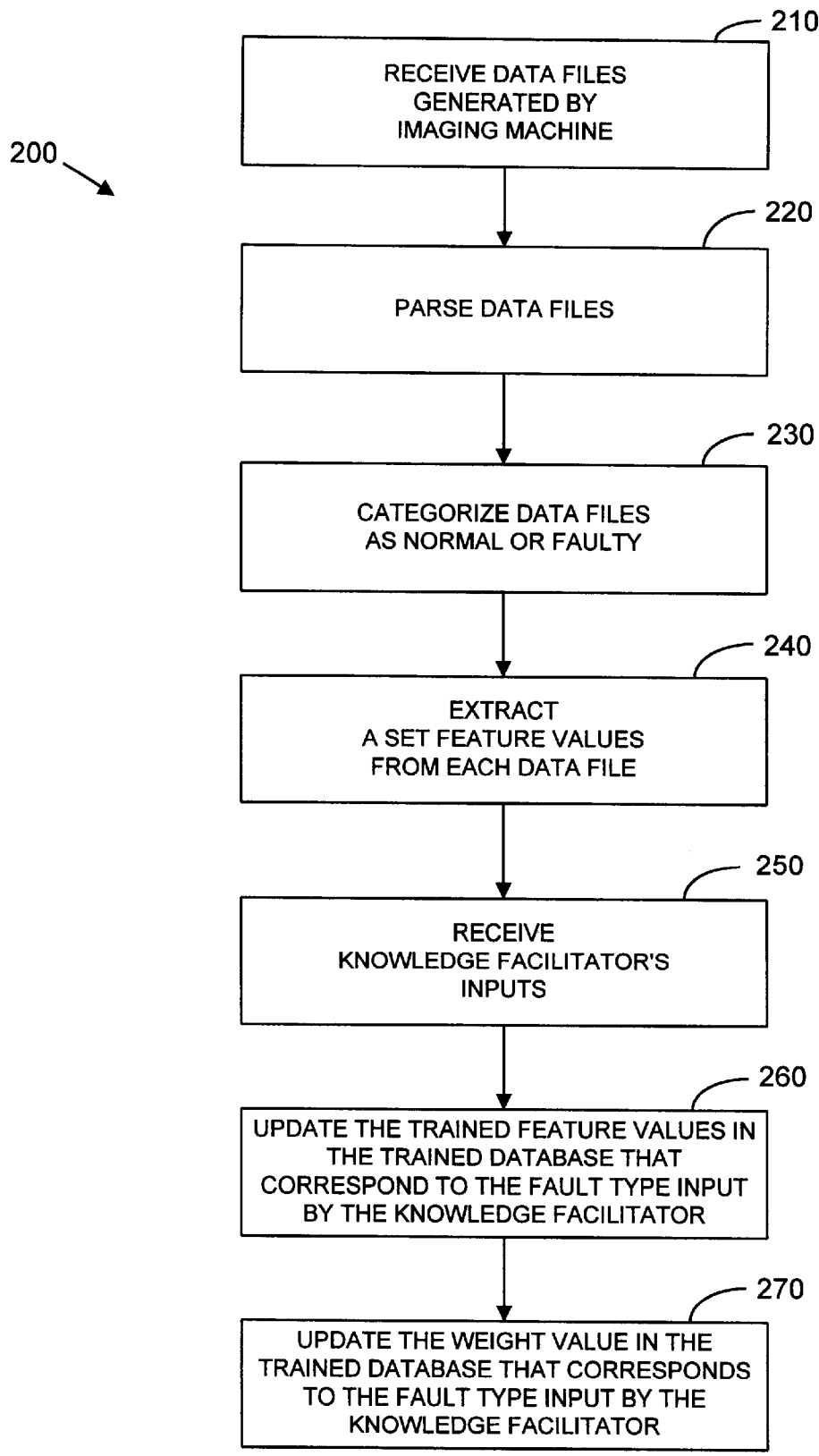
FIG. 2 is a flow diagram illustrating the steps performed by the diagnostic system during an analysis mode according to one embodiment of the present invention.

Referring now to FIG. 2, the steps implemented by the diagnostic system in a training mode are shown. In response to a training mode selected by a user, the diagnostic system analyzes the data files produced by a malfunctioning machine for the purpose of learning the operation characteristics associated with the machine having a particular type of fault. It should be noted that the training process may also occur in response to a misdiagnosis produced by the diagnostic system.

The diagnostic system may be trained based on inputs made by a knowledge facilitator or trained with data files produced by a machine having a known fault associated therewith. In steps 210 through 240, the diagnostic system receives data files generated by an imaging machine, parses the data file to remove extraneous data therefrom, categorizes each data file as normal or faulty and extracts a set of feature values from each data file categorized as faulty.

The present diagnostic system may rely on the accumulated experience of a knowledge facilitator (e.g., service engineer) to identify the faulty component or condition associated with the machine under diagnosis. Accordingly, in step 250, the diagnostic system receives inputs (e.g., fault types) made by a knowledge facilitator based on his/her accumulated experience and observations of the data files as well as other operations of the machine. Through this training process, a trained database is developed and updated. The trained database contains multiple sets of feature values, where each set of feature values is associated with a particular fault type.

As an example, a list of some of the known faults of a medical imaging device is provided which may include: inadequately compensated long-time constant eddy currents; environmental magnetic field disturbances; magnitude and constant phase spikes caused by a body preamplifier; spikes caused by a defective IPG; high vibrations caused by rotating machinery on the floor above or below the magnet; failure caused by a defective Y-axis GRAM; and failures caused by a loose dynamic disable box RF connectors on the body coil.

Once a fault type has been input by the knowledge facilitator, the learning process is implemented by updating a set of feature values and corresponding weight value based on the current feature values extracted from the data files generated by the machine with a known fault type. Accordingly, in steps 260 and 270, trained feature values (e.g., a centroid) and corresponding weight value, associated with a particular fault type provided by the knowledge facilitator, are updated. The feature values for a particular fault type may be updated, for example, by averaging the feature values obtained during all training cases for that particular fault type.

In addition to updating feature values, the learning subsystem is also configured to assign or update a weight value corresponding to each fault type. Wk is the weight value for the $k^{th}$ fault and is mathematically given as follows:

$$w_k = \frac{n_k}{N} dF_k, \qquad (20)$$

where $n_k$ is the count of the trained cases in the database for the $k^{th}$ fault, and N is the total number of trained cases in the database for all fault types.

$dF_k$ is mathematically given as follows:

$$dF_k = \frac{1}{\sqrt{(f_{new1} - f_{k1})^2 + (f_{new2} - f_{k2})^2 + \ldots + (f_{newn} - f_{kn})^2}} \qquad (21)$$

where $f_{new1} \ldots f_{newn}$ are the feature values for the current data set.

The resulting feature and weight values are updated in the trained database and are accessed by the fault detector for diagnosing faults in an analysis mode.

Figure 3:
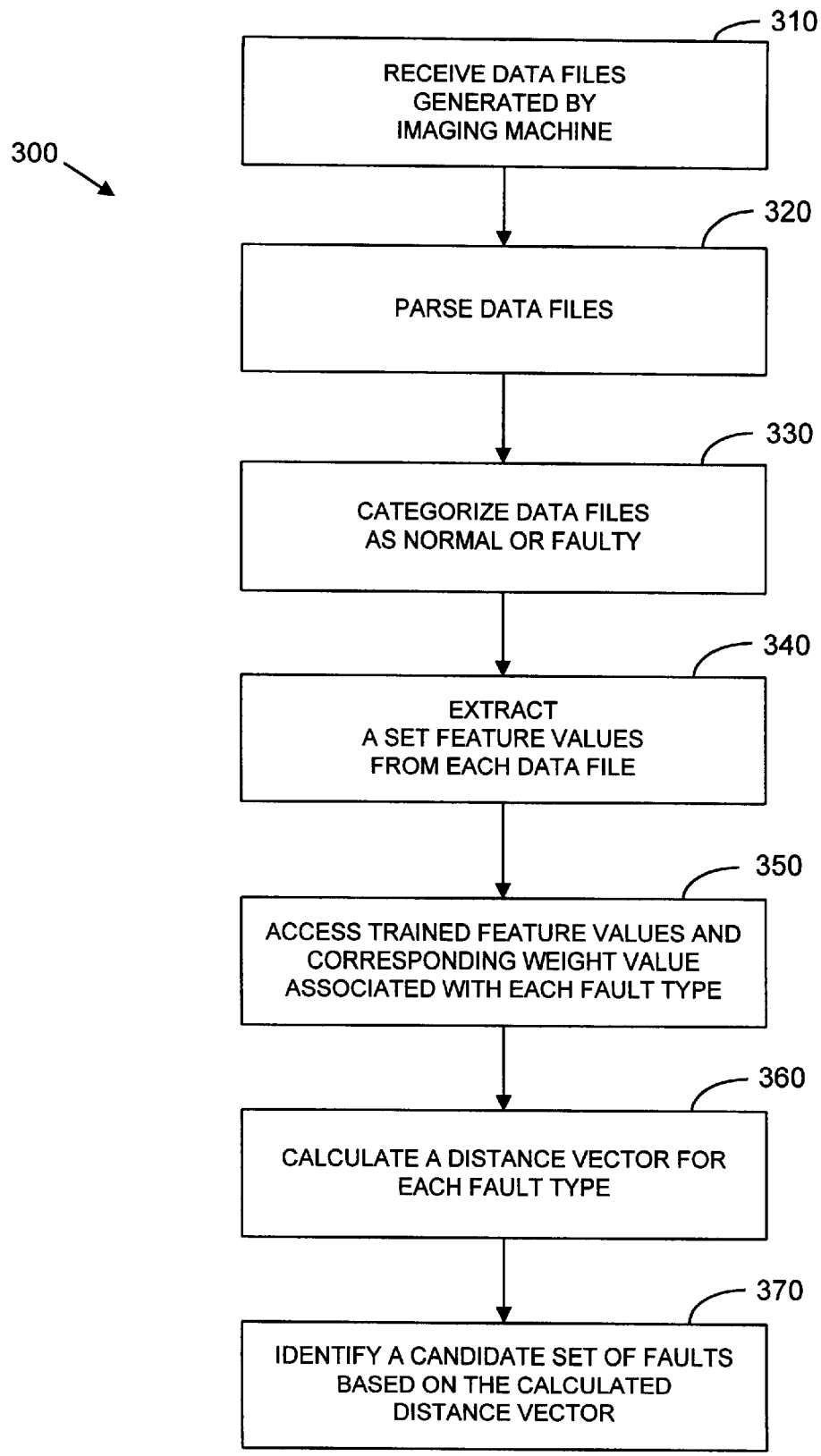
FIG. 3 is a flow diagram illustrating the steps performed by the diagnostic system during an analysis mode according to another embodiment of the present invention.

Referring to FIG. 3, the steps implemented by the diagnostic system in the analysis mode according to one embodiment are shown. In the analysis mode, the machine malfunctions may be diagnosed through analysis of data files generated from a malfunctioning machine. In steps 310 through 340, the diagnostic system receives data files generated by imaging machine, parses the data file to remove extraneous data therefrom, categorizes each data file as normal or faulty and extracts a set of feature values from each data file categorized as faulty.

As noted above, the set of feature values extracted from each data file characterizes the operation and performance of the machine. The trained data contained in the trained database may be used to identify a fault type that most closely matches with the feature values extracted from the data file. In step 350, the fault detector accesses trained feature values (centroid) and corresponding weight associated with each fault type. Then in step 360, the fault detector computes a distance vector, for each fault type, which represents how closely the extracted feature values match with the trained feature values of the corresponding fault type.

A distance vector or the degree of fulfillment ($D_k$) for the $k^{th}$ fault is calculated as follows:

$$D_k = w_k * dF_k \qquad (22)$$

As noted above, $w_k$ is the weight value for the $k^{th}$ fault and is mathematically given as follows:

$$w_k = \frac{n_k}{N} dF_k,$$

where $n_k$ is the count of the trained cases in the database for the kth fault and N is the total number of trained cases in the database for all fault types.

$dF_k$ is mathematically given as follows:

$$dF_k = \frac{1}{\sqrt{(f_{new1} - f_{k1})^2 + (f_{new2} - f_{k2})^2 + \ldots + (f_{newn} - f_{kn})^2}}$$

where $f_{new1} \ldots f_{newn}$ are the feature values for the current data set.

In step 370, a candidate set of faults is identified based on the distance vectors calculated. For example, the fault detector may select one of the trained fault types that has the greatest $D_k$ value. The fault detector may employ a threshold value to determine if the selected fault type has a sufficiently large $D_k$ value to be considered as an identifiable fault. In cases where values of distance vectors ($D_k$) fall below a certain threshold value, the fault detector may allow a user (e.g., knowledge facilitator) to manually assign a faulty type.

Figure 4:
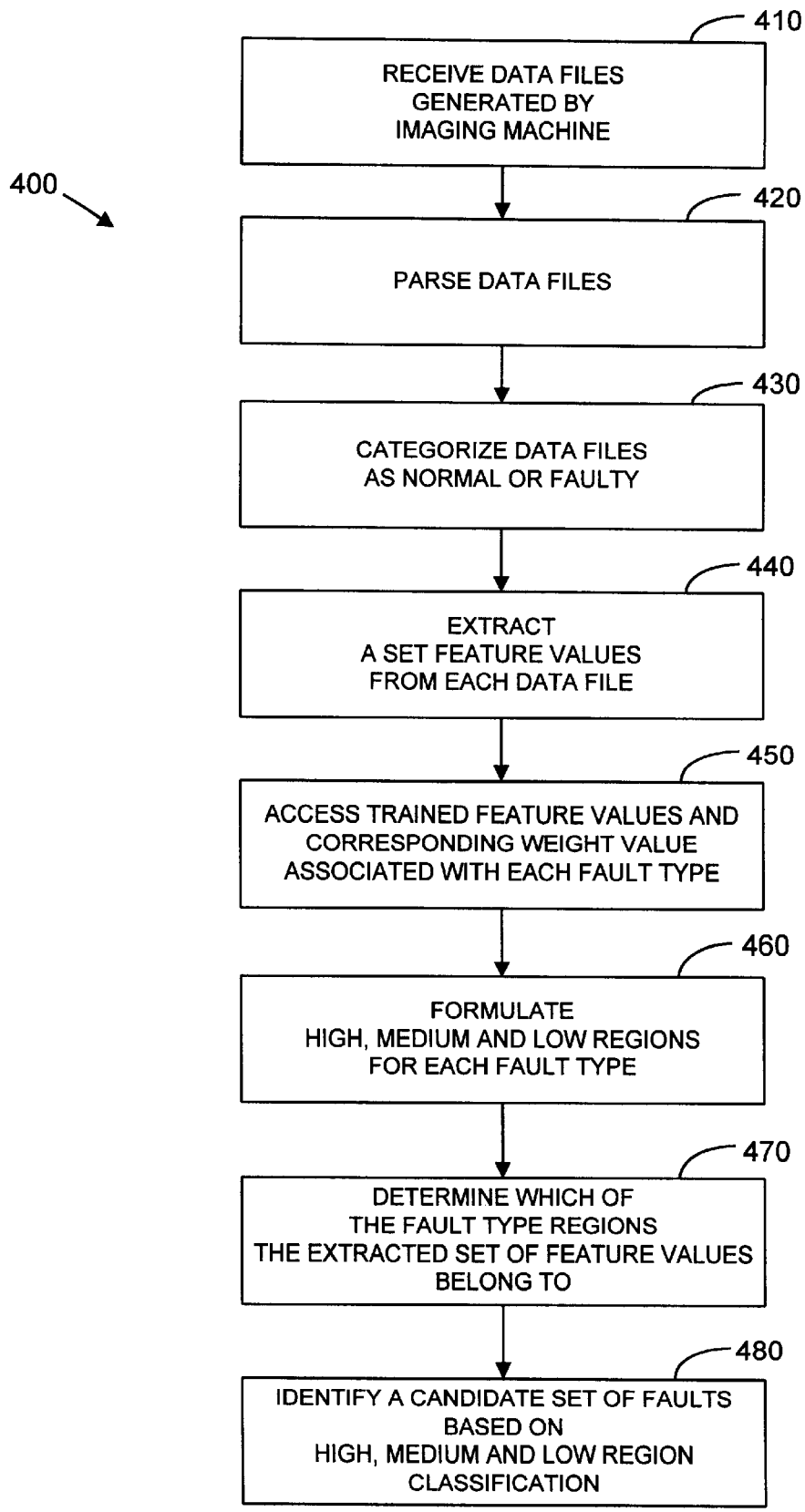
FIG. 4 is a flow diagram illustrating the steps performed by the diagnostic system during a training mode.

Referring to FIG. 4, the steps implemented by the diagnostic system during an analysis mode according to another embodiment are shown. The steps described in this embodiment may be implemented alternatively or in conjunction with the steps described with respect to FIG. 3. As noted above, the diagnostic system receives data files generated by imaging machine (step 410), parses the data file to remove extraneous data therefrom (step 420), categorizes each data file as normal or faulty (step 430) and extracts a set of feature values from each data file categorized as faulty (step 440). Then, in step 450, the fault detector accesses trained feature values and corresponding weight value associated with each fault type from the trained database. Then, in step 460, the fault detector formulates a plurality of regions for each fault type, wherein each region is represented by maximum and minimum acceptable values.

Figure 5:
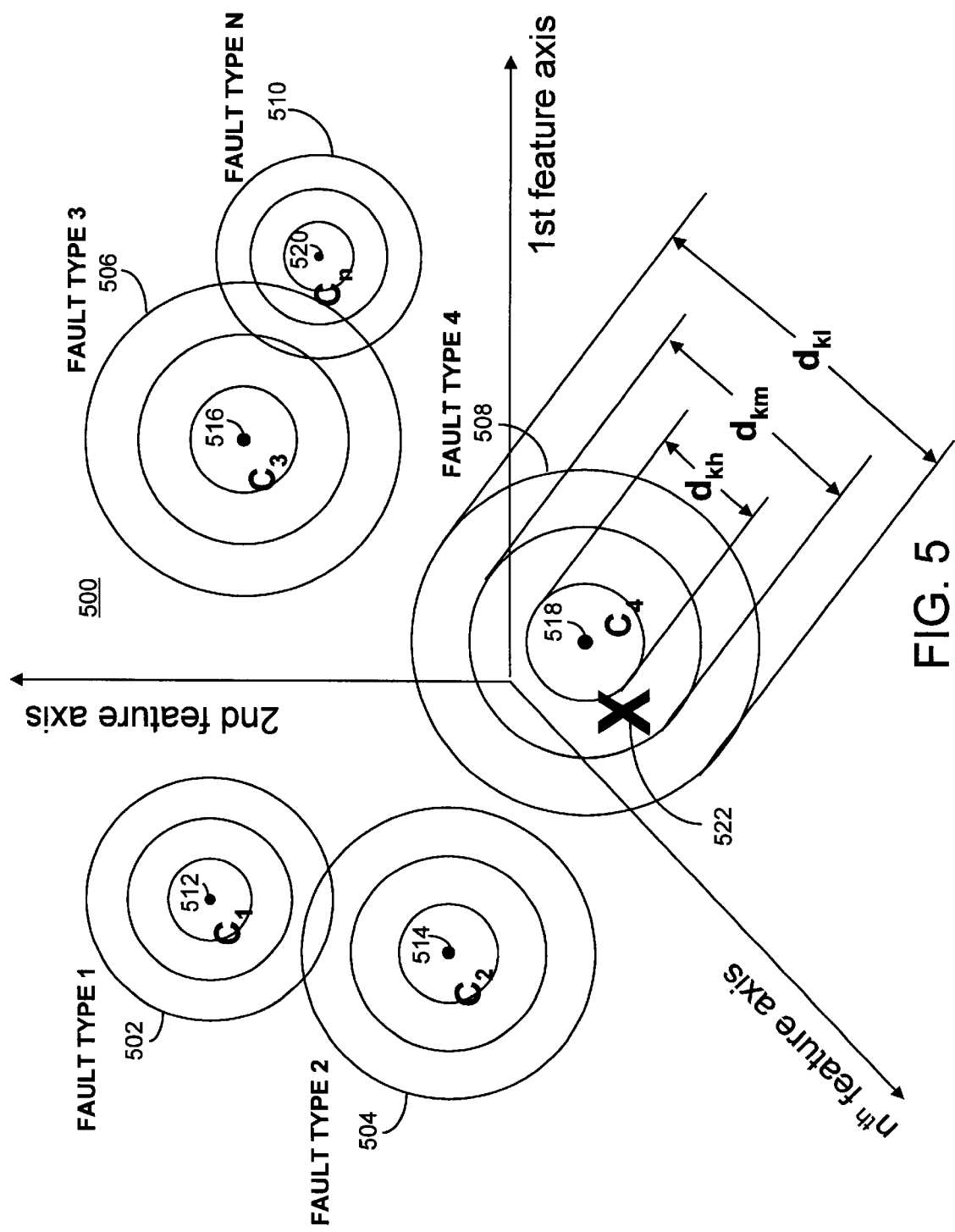
FIG. 5 is a graph illustrating centroids of different fault types relative to the centroid of a current data set in a multi-dimensional space.

Referring momentarily to FIG. 5, a classification model may be employed which defines regions in the form of high, medium and low envelopes ($d_{kh}$, $d_{km}$, $d_{kl}$, respectively) with respect to each fault type (502–510). Each fault type is represented by a centroid (512–520) as well as a plurality of defined regions surrounding thereabout. The graph also shows an example of a centroid of the extracted feature values 522 relative to the centroids (512–520) of the trained fault types (502–510) in a multi-dimensional space.

The centroid values for the $A^{th}$ fault type are as follows:

$$a_A = (f_{A1}, f_{A2}, f_{A3}, \ldots f_{An}) \qquad (23)$$

where, $f_{Ai}$ is the feature for $i^{th}$ feature of fault type A.

The feature axes shown in FIG. 5 represent the features extracted from the data files (e.g., minimum and maximum values of the time series, the peak-to-peak distance of the time series, etc.). The fault types shown in FIG. 5 represent the different types of known fault types that have already been trained into the system (e.g., an RF receive fault, RF transmit fault, shim fault, gradient axis fault, transient vibration, etc.).

As an illustrative example, the high, medium and low envelopes may be derived by assigning radii of 10, 15 and 20% of the corresponding feature values, respectively. Mathematically, the three regions of High ($d_{Kh}$), Medium ($d_{Km}$) and Low ($d_{K1}$) are defined as follows:

$d_{Kh} = [\{0.9*f_{k1}, 1.1*f_{k1}\}, \{0.9*f_{k2}, 1.1*f_{k2}\}, \ldots; \{0.9*f_{kn}, 1.1*f_{kn}\}]$ $d_{Km} = [\{0.85*f_{k1}, 0.9*f_{k1}\} \& \{1.1*f_{k1}, 1.15*f_{k1}\}, \ldots; \{0.85*f_{kn}, 0.9*f_{kn}\} \& \{1.1*f_{kn}, 1.15*f_{kn}\}]$ $d_{K1} = [\{0.8*f_{k1}, 0.85*f_{k1}\} \& \{1.15*f_{k1}, 1.2*f_{k1}\}, \ldots; \{0.8*f_{kn}, 0.85*f_{kn}\} \& \{1.15*f_{kn}, 1.2*f_{kn}\}]$ After the high, medium and low regions have been defined, the fault detector determines which of the fault type regions the extracted set of feature values belongs to (step 470). Once the classification of the extracted set of feature values has been completed, identification of a candidate set of faults associated with the imaging machine is made by the fault detector based on high, medium and low region classification (step 480). Alternatively, or in addition to, the user interface may present the candidate set of faults produced by the fault detector to users (e.g., service engineers) and allow the users to choose among the candidate set of faults based on their accumulated experience in servicing these machines.

Referring back to FIG. 1, all the information (e.g., a candidate set of faults) generated by the fault detector 114 may be combined in a fusion module 118 to narrow down the candidate set of faults into one fault type. The fusion module 118 may also be configured to generate a confidence value for the fault type identified. Because the fault detector identifies a fault type for each data file it analyses, there can be more than one fault type diagnosed. In one embodiment, a set of rules (i.e., contained in a rule base 128) is used by the fusion module 118 to consolidate the information with regard to different fault types produced by the fault detector. Based on the fault type derived at the fusion level, a recommended repair procedure corresponding to the fault type is presented to the user at 116.

The development of the rule base 128 may be accomplished by an expert system. The rule base includes a plurality of IF-THEN rules to establish relationships among different fault types identified for different data files. The implementation of such expert system and rule-base as well as the system performance test ("SPT") are discussed in detail in U.S. Pat. No. 6,105,149 entitled "System and Method for Diagnosing and Validating a Machine using Waveform Data," which is incorporated herein by reference in its entirety.

The diagnostic system of the present invention may be implemented with a computer or any computing device capable of performing sequential program executions, including portable computers used by field engineers, or a computer or workstation provided at the operator console. The diagnostic system may be embodied in the form of software programmed in C++, JAVA, MATLAB or any other suitable programming language.

While the foregoing preferred embodiments of the invention have been described and shown, it is understood that variations and modifications, such as those suggested and others within the spirit and scope of the invention, may occur to those skilled in the art to which the invention pertains. The scope of the present invention accordingly is to be defined as set forth in the appended claims.

What is claimed is:

1. A system for diagnosing a machine by analyzing a data file generated by the machine, comprising:
   a trained database which contains a plurality of trained data associated with a plurality of fault types;
   a feature extractor which extracts a plurality of feature values from the data file;
   a fault detector which receives said plurality of feature values extracted and produces a candidate set of faults based on said plurality of trained data;
   a user interface which presents said candidate set of faults produced by said fault detector to a user and allows said user to interactively input a faulty condition associated with the machine; and
   a learning subsystem which updates said plurality of trained data based on said faulty condition input by said user.

2. The system of claim 1, wherein each of said plurality of trained data is associated with a respective one of said fault types represented by a trained set of feature values and corresponding weight values, said corresponding weight values indicate a relationship between said respective one of said fault types and said corresponding trained set of feature values.

3. The system of claim 2, wherein said fault detector is configured to:
   access said trained set of feature values for each respective fault type;
   calculate a distance vector for each of said fault types, representing how closely the extracted feature values match with said trained set of feature values based on said trained set of feature values and said corresponding weight values; and
   identify said candidate set of faults based on said distance vector calculated for each fault type.

4. The system of claim 2, wherein said fault detector is configured to:
   access said trained set of feature values for each respective fault type;
   compute a plurality of regions for each of said fault types, each respective region represented by corresponding maximum and minimum values;
   determine, for each of said fault types, which of said plurality of regions, the extracted feature values fall into based on said corresponding maximum and minimum values computed; and
   based thereon, identify said candidate set of faults.

5. The system of claim 2, wherein said learning subsystem is configured to update said trained set of feature values corresponding to one of said fault types that corresponds to said faulty condition input by said user, based on said feature values extracted.

6. The system of claim 2, wherein said learning subsystem is configured to update said weight values corresponding to one of said faulty types, that corresponds to said faulty condition input by said user, based on a total number of trained cases for all fault types and a total number of trained cases for said one of said faulty types.

7. The system of claim 1, further comprising a parser which receives the data file generated by said machine and removes extraneous data from the data file before features are extracted from said data file.

8. The system of claim 1, further comprising a gross filter which categorizes the data file as normal or faulty data, and wherein features are extracted only from data files categorized as faulty data.

9. The system of claim 1, wherein said machine being diagnosed is an imaging system.

10. A method for diagnosing a machine by analyzing a data file generated by the machine, comprising:
   receiving the data file generated by the machine;
   extracting a plurality of feature values from the data file received;
   accessing a plurality of trained data associated with a plurality of known fault types;
   producing a candidate set of faults based on said plurality of feature values extracted and said plurality of trained data accessed;
   presenting said candidate set of faults produced to a user;
   allowing said user to interactively input a faulty condition associated with the data file; and
   updating said plurality of trained data based on said faulty condition input by said user.

11. The method of claim 10, wherein each of said plurality of trained data includes a trained set of feature values and corresponding weight values for each of said plurality of known faulty types.

12. The method of claim 11, wherein said step of producing a candidate set of faults further comprises the steps of:

accessing said trained set of feature values and corresponding weight values for each respective fault type;

calculating a distance vector for each of said fault types, representing how closely the extracted feature values match with said trained set of feature values based on said trained set of feature values and said corresponding weight values; and identifying said candidate set of faults based on said distance vector calculated for each fault type.

13. The method of claim 11, wherein said step of producing a candidate set of faults further comprises the steps of:

accessing said trained set of feature values for each respective fault type;

computing a plurality of regions for each of said fault types, each respective region represented by corresponding maximum and minimum values;

determining, for each of said fault types, which of said plurality of regions, the extracted feature values fall into based on said corresponding maximum and minimum values computed; and based thereon, identifying said candidate set of faults.

14. The method of claim 11, wherein said step of updating said plurality of trained data further comprises the step of updating said trained set of feature values corresponding to one of said fault types, that corresponds to said faulty condition input by said user, based on said feature values extracted.

15. The method of claim 11, wherein said step of updating said plurality of trained data further comprises the step of updating said weight values corresponding to one of said faulty types, that corresponds to said faulty condition input by said user, based on a total number of trained cases for all fault types and a total number of trained cases for said one of said faulty types.

16. The method of claim 10, further comprising the step of removing extraneous data from the data file before features are extracted from said data file.

17. The method of claim 10, further comprising the step of categorizing the data file as normal or faulty data, and wherein features are extracted only from data file categorized as faulty data.

18. The method of claim 10, wherein said machine being diagnosed is an imaging system.

* * * * *

UNITED STATES PATENT AND TRADEMARK OFFICE
CERTIFICATE OF CORRECTION

PATENT NO.    : 6,442,542 B1                                           Page 1 of 1
DATED         : August 27, 2002
INVENTOR(S)   : Vipin K. Ramani et al.

It is certified that error appears in the above-identified patent and that said Letters Patent is hereby corrected as shown below:

<u>Title page,</u>
Item [75], Inventors, please add: -- Mark Mitchell Kornfein of Latham, New York, USA -- as an Inventor Signed and Sealed this Third Day of December, 2002

JAMES E. ROGAN
*Director of the United States Patent and Trademark Office*